United States Patent
Büyükbas et al.

(10) Patent No.: US 8,396,631 B2
(45) Date of Patent: Mar. 12, 2013

(54) CONTROL DEVICE FOR A MOTOR VEHICLE

(75) Inventors: Turhan Büyükbas, Erlangen (DE); Helmut Karrer, Fürth (DE); Jürgen Rietsch, Hof (DE); Jürgen Henniger, Erlangen (DE); Matthias Gramann, Ranchen (DE); Matthias Wieczorek, Sand (DE); Klaus Scharrer, Hohenstadt (DE); Peter Guth, Nürnberg (DE)

(73) Assignee: Conti Temic microelectronic GmbH (DE)

( * ) Notice: Subject to any disclaimer, the term of this patent is extended or adjusted under 35 U.S.C. 154(b) by 381 days.

(21) Appl. No.: 12/602,372

(22) PCT Filed: May 30, 2008

(86) PCT No.: PCT/DE2008/000893
§ 371 (c)(1),
(2), (4) Date: Apr. 21, 2010

(87) PCT Pub. No.: WO2008/145107
PCT Pub. Date: Dec. 4, 2008

(65) Prior Publication Data
US 2010/0198465 A1    Aug. 5, 2010

(30) Foreign Application Priority Data

Jun. 1, 2007  (DE) .......................... 10 2007 025 859

(51) Int. Cl.
*G06F 7/00* (2006.01)
*F16M 13/00* (2006.01)
*G01D 11/24* (2006.01)

(52) U.S. Cl. .............................. 701/49; 248/599; 73/431

(58) Field of Classification Search .................. None
See application file for complete search history.

(56) References Cited

U.S. PATENT DOCUMENTS 2,832,554 A * 4/1958 Reisch .......................... 248/603
4,511,840 A * 4/1985 Leach, Jr. ...................... 324/160
(Continued)

FOREIGN PATENT DOCUMENTS

| DE | 4015561 A1 | 11/1991 |
| DE | 4431696 C1 | 1/1996 |

(Continued)

*Primary Examiner* — Ryan Zeender
*Assistant Examiner* — Dana Amsdell
(74) *Attorney, Agent, or Firm* — RatnerPrestia

(57) ABSTRACT

A controller for a motor vehicle with a carrier plate for receiving a component carrier with a component carrier foot. The carrier plate has a recess through which the component carrier can be passed and which is suitable for receiving the foot, wherein the dimensions of the recess in the region of the component carrier and in the region of the foot in the X/Y-direction correspond to maximum admissible dimensions of the component carrier and of the foot (5) in the X/Y-direction. In the Z-direction, a pressing geometry is arranged on the recess or on the foot such that after establishing a positive-fit or non-positive connection between the carrier plate and a system interface, the pressing geometry or a part that is arranged opposite the pressing geometry is in such a deformed state that the foot is in the recess in a fixed state and without play.

9 Claims, 1 Drawing Sheet

U.S. PATENT DOCUMENTS

| | | | |
|---|---|---|---|
| 5,195,717 A | | 3/1993 | Benz et al. |
| 5,199,003 A | * | 3/1993 | Gjestrum .................. 367/20 |
| 5,325,734 A | * | 7/1994 | Jordan .................. 73/866.5 |
| 5,724,709 A | * | 3/1998 | Kittmann et al. ............ 24/453 |
| 6,158,609 A | * | 12/2000 | Kaiser .................. 220/480 |
| 6,296,236 B1 | * | 10/2001 | Ott .................. 267/140.11 |
| 7,377,160 B2 | | 5/2008 | Böhm et al. |
| 2001/0011478 A1 | * | 8/2001 | Albert et al. .................. 73/431 |
| 2007/0137408 A1 | * | 6/2007 | Lassiter .................. 74/551.8 |
| 2009/0064779 A1 | | 3/2009 | Ott |

FOREIGN PATENT DOCUMENTS

| | | |
|---|---|---|
| DE | 102004034002 A1 | 2/2006 |
| DE | 102005021717 A1 | 11/2006 |
| DE | 102005040169 A1 | 3/2007 |

* cited by examiner

CONTROL DEVICE FOR A MOTOR VEHICLE

CROSS REFERENCE TO RELATED APPLICATIONS

This application is the U.S. national phase application of PCT International Application No. PCT/DE2008/000893, filed Mar. 30, 2008, which claims priority to German Patent Application No. DE102007025859.5 filed Jun. 1, 2007, the content of such application being incorporated by reference herein.

FIELD OF THE INVENTION

The invention relates to a controller for a motor vehicle.

BACKGROUND OF THE INVENTION

In motor vehicles, controllers with an electronic control unit and with associated components, such as sensors, are used for various tasks. When they are used in a gearbox, for example, rotational speeds of shafts and positions of speed selectors are sensed by means of sensors. On the basis of this information, the electronic control unit controls, among other things, gear shifting in the gearbox. The electronic control unit is usually arranged on a carrier plate and enclosed by a housing body. The sensors are separated from the electronic control unit and positioned in the immediate vicinity of the parts to be sensed and are electrically connected to the electronic control unit via electric conductors, particularly via pressed screens; this arrangement is determined by the application. The pressed screens are usually plastic-coated by injection-moulding around them and form, together with the sensor as an electric component and with a sensor cover, a component carrier (also called sensor dome).

When several component carriers are used, they are particularly coated as a whole by injection-moulding around them in an injection-moulding process to form a single monolith. This monolith is usually a part of the housing body that encloses the electronic control unit, said housing body being connected to the carrier plate preferably by screwing, caulking or riveting. Thus, the sensor can be electrically connected to the electronic control unit on the carrier plate via the pressed screen in the component carrier and particularly via a flexible foil conductor that is laminated onto the carrier plate.

The completed controller may be connected to a system interface, for example to a gearbox or to hydraulic equipment. The tolerance chains in the step of positioning the sensor relative to the part to be sensed, with the connection between the controller and the system interface as a reference point, are on the one hand particularly dependent on the tool parameters during the manufacture of the monolith, and on the shrinkage processes after coating the component carriers as a whole by injection-moulding around them. Connecting the monolith or the housing body to the carrier plate may result in a further tolerance chain. If there are any subsequent furnace processes, they may cause additional inaccuracy with respect to the positioning of the sensor.

SUMMARY OF THE INVENTION

It is therefore an object of the invention to provide a controller for motor vehicles that reduces the tolerance chains in the step of positioning an electronic component, such as a sensor, relative to a part to be sensed.

The carrier plate of the controller has a recess for receiving the component carrier foot, wherein the dimensions of the recess in the region of the component carrier foot in the X/Y-direction correspond to the maximum dimensions of the component carrier foot (5) in the X/Y-direction.

The carrier plate has a partially continuous recess through which the component carrier can be passed and which is further suitable for receiving the component carrier foot. The dimensions of the recess in the X/Y-direction in the region of the component carrier and in the region of the component carrier foot correspond to the maximum admissible dimensions of the component carrier and of the component carrier foot in the X/Y-direction. In the Z-direction, at least one pressing geometry is arranged on the recess of the carrier plate or on the component carrier foot in such a manner that after establishing a positive-fit or non-positive connection between the carrier plate and a system interface, such as a gearbox or hydraulic equipment, the pressing geometry or the part resting on the pressing geometry is in such a deformed state that the component carrier foot is in the recess in a fixed state and without play. The advantage of this modular arrangement of component carriers on the carrier plate consists in the fact that, above all, the tolerance chain caused by coating the component carriers (when several component carriers are used) as a whole by injection-moulding around them to form a single monolith is eliminated. The only tolerance chains that remain are caused by the position of the electronic component in the component carrier itself and by the positioning of the controller at the system interface.

A controller according to aspects of the invention makes a great variety of realisations of the pressing geometry with respect to the material and the type of the fixture possible and reduces, above all, the tolerance chain in the Z-direction.

A controller according to aspects of the invention simplifies handling, both with respect to arranging the component carrier on the carrier plate and with respect to establishing a connection between the carrier plate and the system interface, since the final positioning of the component carrier, and thus of the electronic component, relative to the part to be sensed takes place in this last step only.

A controller according to aspects of the invention enables the electric connection between the electronic component in the sensor pocket of the component carrier and the electronic control circuit on the carrier plate to be established prior to the final positioning of the component carrier.

A controller according to aspects of the invention represents a simple possibility of positioning the component carrier in the X/Y-direction.

A controller according to aspects of the invention results in the centering pin of the component carrier being clamped in the bore of the system interface, wherein this clamping, and thus the positioning in the X/Y-direction, is particularly also maintained when there are variations in the ambient temperature of the component carrier.

A controller according to aspects of the invention enables the carrier plate, and thus the controller, to be connected to the system interface in a simple and cost-effective manner.

Further advantages and features of the invention can be inferred from the following description of an exemplary embodiment of the invention on the basis of the drawings.

DETAILED DESCRIPTION OF THE PREFERRED EMBODIMENTS

Figure 1:
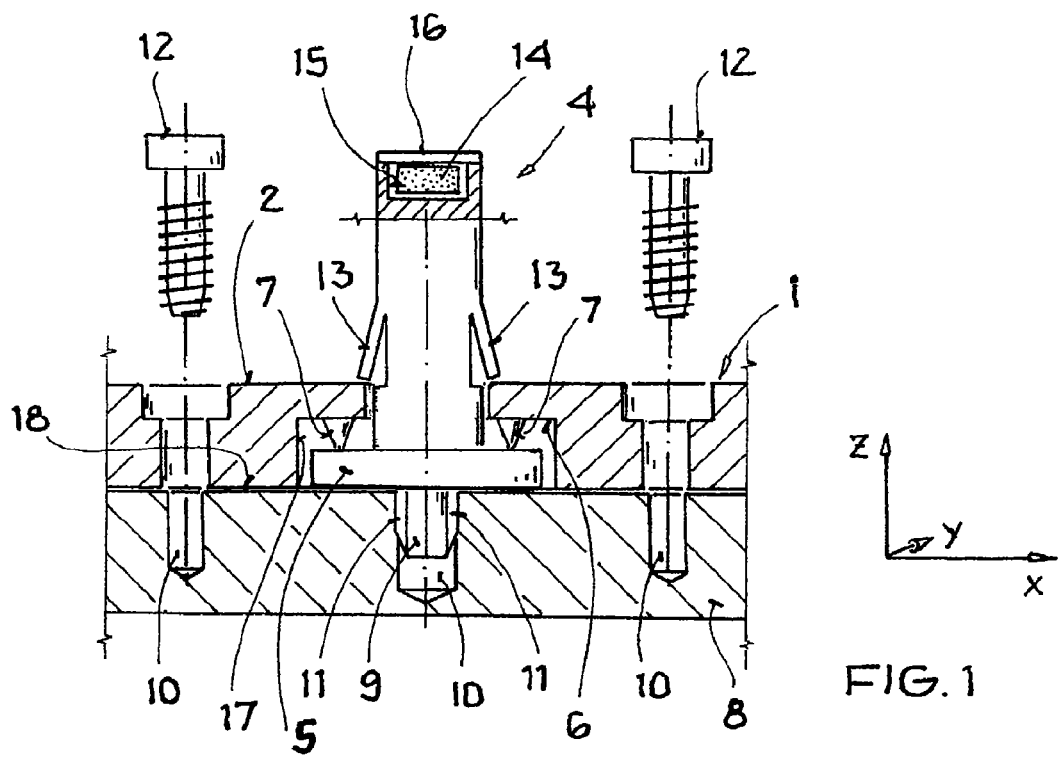
FIG. 1 shows a controller prior to being connected to a system interface.

FIG. 1 shows a carrier plate 1 of a controller with a component carrier 4 prior to being connected to a system interface 8 by screwing by means of screws 12. At one end, the component carrier 4 has a sensor pocket 15 for receiving an electronic component that is a sensor 14 in this case. A cover 16 seals the sensor pocket 15. In particular, the dimensions of the sensor 14 and of the sensor pocket 15 are such that the cover 16, in the mounted state, fixes the sensor 14 in the sensor pocket 15 with a certain prestress. At the other end, the component carrier 4 has a component carrier foot 5 whose cross-section is at least partially greater than the cross-section of the actual component carrier 4. For example, when the component carrier 4 is cylindrical, the diameter of the component carrier foot 5 is greater than the diameter of the actual component carrier 4. A rectangular cross-section is also possible. It is also possible that the component carrier foot 5 projects in the form of two extension arms, for example, at the end of the component carrier 4 at a right angle.

The recess 6 of the carrier plate 1 is realized as a continuous bore with two different cross-sections. The cross-section at the top 2 of the carrier plate 1 corresponds to the nominal dimension of the cross-section of the actual component carrier 4 plus the greatest possible tolerance dimension. The cross-section at the bottom 3 of the carrier plate 1 corresponds to the nominal dimension of the cross-section of the component carrier foot 5 plus the greatest possible tolerance dimension. If the respective greatest possible tolerance dimensions of the two cross-sections differ from each other, the greater one of the two tolerance dimensions is used.

On the outside of the component carrier 4, two detent lugs 13 are arranged in such a manner that when inserting the component carrier 4 into the recess 6, the detent lugs 13, after passing the top 2 of the carrier plate 1, are locked in such a manner, that the component carrier 4 still has play in the carrier plate 1 in the X/Y/Z-direction. The number of detent lugs 13 may also be different from two.

In the recess 6, at the bottom 3 of the metallic carrier plate 1, a pressing geometry 7 projecting from the bottom 3 is integrally formed with the carrier plate 1. Alternatively, the pressing geometry 7 may be injection-moulded as a plastic part on the bottom 3 of the carrier plate 1 in the corresponding region of the recess 6. It is also possible that a plastic pressing geometry 7 is arranged on the component carrier foot 5 at the top 2 or bottom 3 thereof. In particular, the pressing geometry 7 and the component carrier foot 5 may be integrally formed in this case. In particular, the sum of the dimensions of the pressing geometry 7 and of the component carrier foot 5 (in the Z-direction each) is greater than the depth 17 (also in the Z-direction) of the recess 6 in the region with the greater cross-section. When mounting the carrier plate 1 to the system interface 8, the pressing geometry 7 is deformed if it is made of plastic. However, if it is a part of the metallic carrier plate 1, the part that is arranged opposite the pressing geometry 7 is deformed when mounting the carrier plate 1 to the system interface 8, wherein the part that is arranged opposite the pressing geometry 7 is the plastic component carrier foot 5. In any case, during mounting, the component carrier 4 is pressed against the bearing surface 18 of the system interface 8 in the region of the component carrier foot 5, whereby it is fixed. The pressing geometry 7 may be designed such that it is punctual or arranged partially or completely circumferentially (for example, torically) on the recess 6 or the component carrier foot 5.

As shown in FIG. 1, the bottom of the component carrier foot 5 has a cylindrical centering pin 9 that projects at a right angle. In this case, the centering pin 9 is centrically arranged at the bottom of the component carrier foot 5. It is also possible to use several centering pins 9 that are evenly or randomly distributed over the bottom of the component carrier foot 5.

Figure 2:
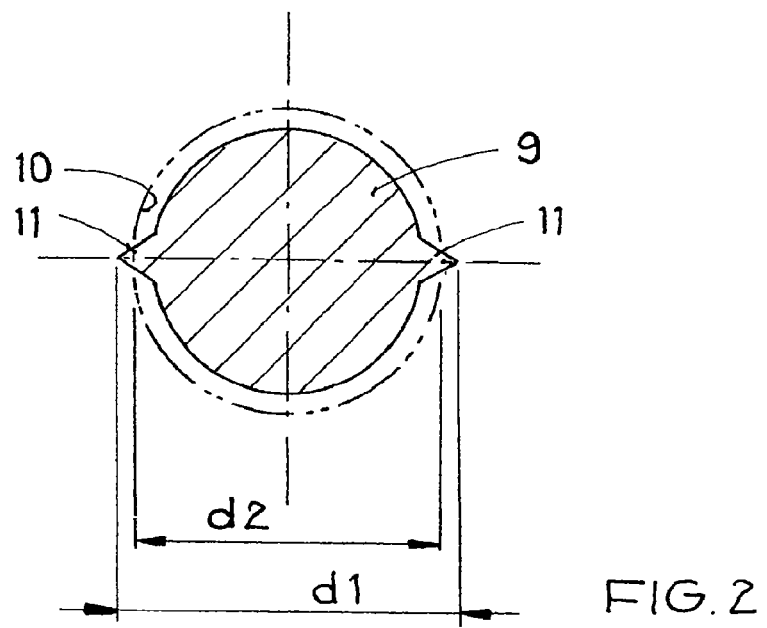
FIG. 2 is a cross-sectional view of a centering pin with two clamping ribs in a bore.

In particular, the centering pin 9 has at least two clamping ribs 11 that are circumferentially evenly distributed and extend parallel to the axis of the centering pin 9. When mounting the carrier plate 1 to the system interface 8, the centering pin 9 is inserted into a corresponding bore 10 in the system interface 8. As shown in FIG. 2, the diameter of the centering pin 9, in the region of the clamping ribs 11, is slightly greater than the diameter of the corresponding bore 10 in the system interface 8, whereby, after mounting, the centering pin 9 is in the bore 10 of the system interface 8 (pressed therein) and the component carrier 4, and thus the sensor 14, is in its position in the X/Y-direction. The dimension of the centering pin 9 in the Z-direction must be smaller than the depth of the bore 10 in order to ensure that the positioning of the sensor 14 in the Z-direction is not affected by the centering pin 9.

For the X/Y-positioning of the sensor 14, the component carrier foot 5 does not necessarily have to have a centering pin 9. When mounting the carrier plate 1 to the system interface 8, it is also quite possible to position one of the outer surfaces of the component carrier 4 on an X/Y-reference point outside the controller and the system interface 8 near the part to be sensed.

FIG. 1 shows that the carrier plate 1 is connected to the system interface 8 by means of screws 12. Alternatively, the connection could be established by caulking or riveting, for example.

The described controller enables the tolerance chains to be reduced to the component carrier 4 and the system interface 8 when X/Y/Z-positioning an electronic component, particularly a sensor 14, relative to a part to be sensed.

The aim of the presentation of the present invention on the basis of the preceding description was to provide the best possible explanation of the principle of the invention and of the practical application thereof. However, the invention may be naturally realized in numerous other embodiments if it is suitably modified.

The invention claimed is:

1. A controller for a motor vehicle comprising:
   a metallic carrier plate, with a top and a bottom, for receiving an electronic control circuit and for receiving at least one plastic component carrier with a component carrier foot,
   wherein the carrier plate is provided with dimension tolerances at least in a Z-direction and the component carrier foot is provided with dimension tolerances in an X/Y/Z-direction,
   wherein the carrier plate has a partially continuous recess through which the component carrier can be passed and which is further suitable for receiving the component carrier foot,
   wherein the plastic component carrier comprises a detent lug resiliently biased outwardly from a centerline of the component carrier, wherein prior to establishing a connection between the carrier plate and a system interface, the component carrier is locked to the carrier plate by the detent lug, in a region of the component carrier foot and with play, with the carrier plate in the recess, wherein dimensions of the recess in a region of the component carrier and in a region of the component carrier foot in an X/Y-direction correspond to maximum admissible dimensions of the component carrier and of the component carrier foot in the X/Y-direction, and wherein at least one pressing geometry is arranged in the Z-direction on the recess of the carrier plate or on the component carrier foot in such a manner that after establishing a positive-fit or non-positive connection between the carrier plate and the system interface, the pressing geometry or a part that is arranged opposite the pressing geometry is in such a deformed state that the component carrier foot is in the recess in a fixed state and without play.

2. Controller according to claim 1, wherein the pressing geometry is made of plastic and arranged on the component carrier foot or on the recess of the metallic carrier plate, and wherein the pressing geometry is in a deformed state after establishing a connection between the carrier plate and the system interface.

3. Controller according to claim 1, wherein the pressing geometry is a part of the recess of the metallic carrier plate, and wherein the part of the component carrier foot that is arranged opposite the pressing geometry is in a deformed state after establishing a connection between the carrier plate and the system interface.

4. Controller according to claim 1, wherein the pressing geometry is arranged on the component carrier foot or on the recess of the carrier plate in such a manner that it is punctual or completely or partially circumferential in the X/Y-direction and substantially deformable in the Z-direction.

5. Controller according to claim 1, wherein the component carrier receives, at an end that is arranged opposite the component carrier foot, at least one electronic component in a sensor pocket, and that the electronic component can be connected to the electronic control circuit via electric conductors that are integrated in the component carrier and via at least one flexible foil conductor that is arranged on the carrier plate.

6. Controller according to claim 1 further comprising at least one centering pin at a bottom of the component carrier foot, which centering pin can be non-positively inserted into a corresponding bore in the system interface when establishing a connection between the carrier plate and the system interface.

7. Controller according to claim 6, wherein the centering pin has at least two clamping ribs that are circumferentially evenly distributed and extend parallel to an axis of the centering pin, wherein a diameter of the centering pin with the clamping ribs is slightly greater than a diameter of the corresponding bore in the system interface.

8. Controller according to claim 1, wherein the carrier plate can be connected to the system interface by screwing, caulking or riveting.

9. Controller according to claim 1, wherein the system interface is a gearbox or hydraulic equipment.

* * * * *

UNITED STATES PATENT AND TRADEMARK OFFICE
CERTIFICATE OF CORRECTION

PATENT NO. : 8,396,631 B2  Page 1 of 1
APPLICATION NO. : 12/602372
DATED : March 12, 2013
INVENTOR(S) : Büyükbas et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 521 days.

Signed and Sealed this
First Day of September, 2015

Michelle K. Lee
*Director of the United States Patent and Trademark Office*